(12) United States Patent
Lin

(10) Patent No.: US 8,519,259 B2
(45) Date of Patent: Aug. 27, 2013

(54) ELECTRONIC DEVICE HOUSING WITH SOLAR PAINT AND MANUFACTURING METHOD THEREOF

(75) Inventor: Tzu-Wei Lin, Taipei (TW)

(73) Assignee: ASUSTeK Computer Inc., Taipei (TW)

( * ) Notice: Subject to any disclaimer, the term of this patent is extended or adjusted under 35 U.S.C. 154(b) by 467 days.

(21) Appl. No.: 12/767,636

(22) Filed: Apr. 26, 2010

(65) Prior Publication Data

US 2010/0282312 A1   Nov. 11, 2010

(30) Foreign Application Priority Data

May 8, 2009   (TW) ............................... 98115232 A

(51) Int. Cl.
  *H01L 31/18* (2006.01)
  *B05D 5/12* (2006.01)
(52) U.S. Cl.
  USPC ......... 136/256; 257/E31.001; 438/57; 427/74
(58) Field of Classification Search
  USPC .................. 136/256; 257/E31.001; 438/57; 977/742, 948; 427/74
  See application file for complete search history.

(56) References Cited

U.S. PATENT DOCUMENTS

| | | |
|---|---|---|
| 2007/0028958 A1 | 2/2007 | Retti |
| 2007/0151601 A1 | 7/2007 | Jung et al. |
| 2007/0281510 A1 * | 12/2007 | Lin et al. .......................... 439/74 |
| 2008/0084117 A1 | 4/2008 | Sandero et al. |
| 2008/0264482 A1 | 10/2008 | Lee et al. |
| 2008/0283114 A1 | 11/2008 | Gray |
| 2009/0084432 A1 | 4/2009 | Kosmehl |
| 2009/0176102 A1 * | 7/2009 | Lin et al. ....................... 428/413 |
| 2010/0261821 A1 * | 10/2010 | Park et al. ..................... 524/186 |

FOREIGN PATENT DOCUMENTS

| | | |
|---|---|---|
| CN | 101274498 | 10/2008 |
| CN | 101280131 | 10/2008 |
| JP | 2005-142088 A | 6/2005 |

* cited by examiner

*Primary Examiner* — Douglas McGinty
(74) *Attorney, Agent, or Firm* — Muncy, Geissler, Olds & Lowe, PLLC

(57) ABSTRACT

The invention provides an electronic device housing with solar paint and a manufacturing method thereof. Solar-powered paint layers are transferred onto the housing by the IMD technology. Therefore, the housing of the electronic device can generate electric energy via solar power to prolong the operation time of the electronic device and achieve environmental protection and energy conservation effects.

7 Claims, 4 Drawing Sheets

ELECTRONIC DEVICE HOUSING WITH SOLAR PAINT AND MANUFACTURING METHOD THEREOF

BACKGROUND OF THE INVENTION

1. Field of Invention

The invention relates to an electronic device housing and, more particularly, to an electronic device housing with solar paint.

2. Related Art

As oil energy crisis and abnormality and deterioration of the climate become more and more serious, people begin to avoid their over-reliance on natural energy. People also change their ideas about misunderstanding that natural resources are inexhaustible, and increasingly pay attention to environmental protection and energy conservation. Consequently, many companies gradually trend to develop and utilize the so-called green energy.

For the green energy, the ones most easily to be obtained are wind power and solar power. The wind power is generated as long as climate changes. The solar power exits in any place with sunshine. If the green energy can be utilized, damage caused by other polluting energy to the earth may be decreased. Furthermore, the green energy almost may be regarded as exhaustless energy.

However, an application of wind power needs to utilize large blades blown by the wind power to drive a generator to generate and supply energy. The equipment is usually very huge, and the place with enough wind power is also rather limited. Therefore, the application of wind power is narrow and hardly applied at a general electronic device. Consequently, the solar power becomes the quite hot alternative energy presently.

A solar chip is cut according to a current determined in a design, and it is soldered with foil wires. Then, soldered chips are connected in series to be a group via the foil. Afterward, the group and a protection material such as EVA (Ethylene vinyl acetate), tedlar, and low-iron toughened glass are put in a laminator to be vacuum encapsulated to be a solar panel as a module. However, the solar panel is expensive, occupies space, and provides low efficiency. Therefore, it is difficult to widely apply the solar panel in the general electronic device. Recent years, Berkeley University in the US publishes a product called solar paint. The solar paint is directly coated on an outer wall to absorb the solar power and replace the solar panel. However, this paint is still at an undeveloped stage, and how to apply the paint in a practical electronic device still may be improved considerably.

SUMMARY OF THE INVENTION

According to a method for manufacturing an electronic device housing with solar paint, a film is provided, and a solar-powered paint layer is formed on the film. The film with the solar-powered paint layer is placed in a mold, and the housing is formed in a mode such as in-mold decoration (IMD) and is combined with the film. The solar-powered paint layer on the film is thus combined with the housing. The film is removed to make the solar-powered paint layer disposed on a surface of the housing. The solar paint may be effectively applied in products largely via the IMD technology.

On the other hand, an electronic device housing with solar paint according to the invention includes a housing, an adhesive layer, and a solar-powered paint layer. The solar-powered paint layer and the adhesive layer are pre-formed on a film. Then, the solar paint layer is transferred onto the housing via the IMD technology. The solar-powered paint layer may be transparent or colorful, and it may form a special pattern and be disposed on a surface of the housing. Thus, it can absorb solar power to generate electric energy to prolong the operation time of the electronic device, and further to achieve environmental protection and energy conservation effects.

These and other features, aspects and advantages of the present invention will become better understood with regard to the following description, appended claims, and accompanying drawings.

DETAILED DESCRIPTION OF THE INVENTION

According to an electronic device housing with solar paint and a manufacturing method thereof of the invention, solar paint is transferred to the housing via the in-mold decoration (IMD). The IMD is divided into in-mold rolling (IMR), in-mold forming (IMF), and in-mold label (IML) according to its application range.

Figure 1A:
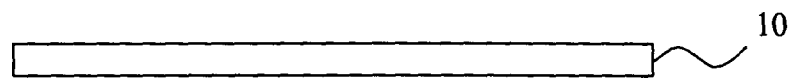
FIG. 1A to FIG. 1E are schematic diagrams showing a patterned film of an electronic device housing with solar paint and a manufacturing method thereof according to an embodiment of the invention.
Figure 1B:
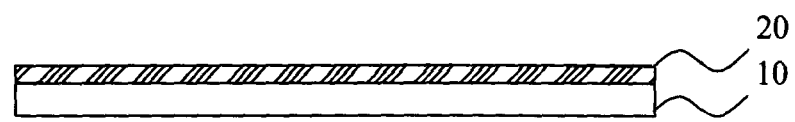
Figure 1C:
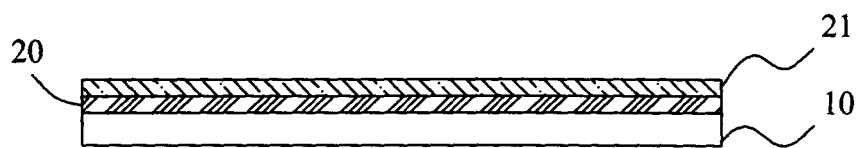
Figure 1D:
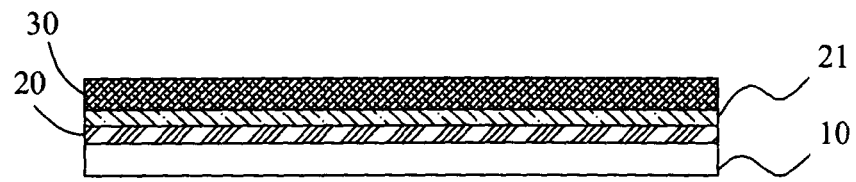

The electronic device housing with the solar paint and the manufacturing method thereof in an embodiment of the invention are illustrated with the most common IMR. First, as shown in FIG. 1A, a film 10 is provided. The film 10 is usually composed of polyester (PET). Second, as shown in FIG. 1B, a stripping layer 20 is formed on the film 10. Third, as shown in FIG. 1C, a hardened layer 21 is formed on the stripping layer 20 to protect a pattern to be formed afterward. Fourth, as shown in FIG. 1D, a solar-powered paint layer 30 is formed on the hardened layer 21. The solar-powered paint layer 30 includes carbon nano tubes and carbon fullerene, and it is energy-storage material made by mixing at least two kinds of paint. The energy-storage material can absorb light with different wavelengths, and it is taken as a coating material to replace a conventional solar panel. The carbon fullerene is a micro-nano-particle composed of sixty carbon atoms, and it also may be called buckminsterfullerene, fullerene, or buckyball.

Figure 1E:
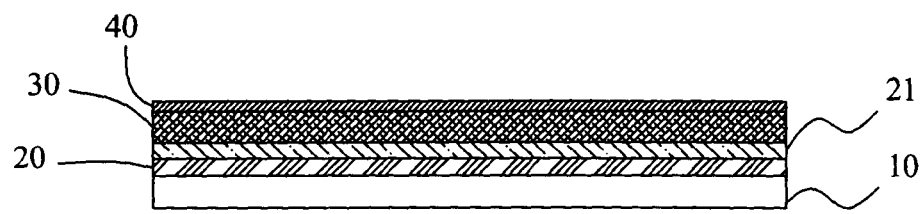

The solar-powered paint layer 30 may be combined with the stripping layer 20 on the film 10 via screen printing, gravure printing, or relief printing. As a result, the solar-powered paint layer 30 may be colorless and transparent, and it also may form different kinds of colors mixed together to present the color with the pattern. As shown in FIG. 1E, a process of producing a patterned film is finished after an adhesive layer 40 is disposed on the solar-powered paint layer 30.

Figure 2A:
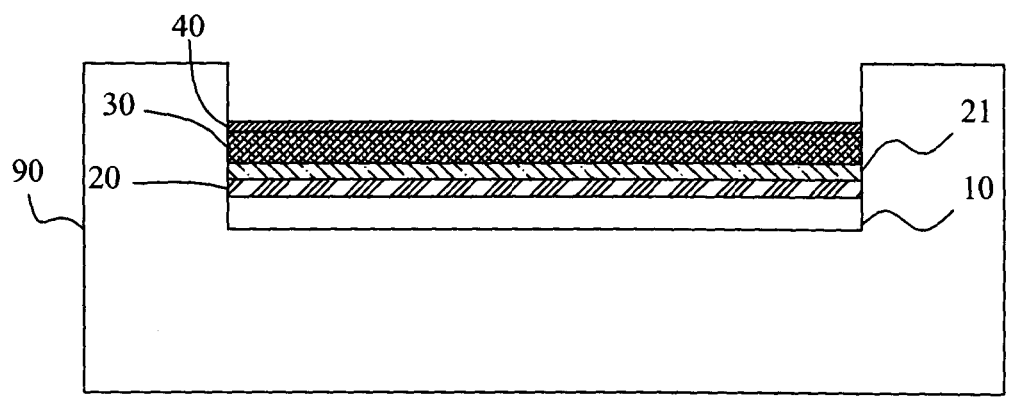
FIG. 2A to FIG. 2C are schematic diagrams showing the IMD of an electronic device housing with solar paint and a manufacturing method thereof according to an embodiment of the invention.
Figure 2B:
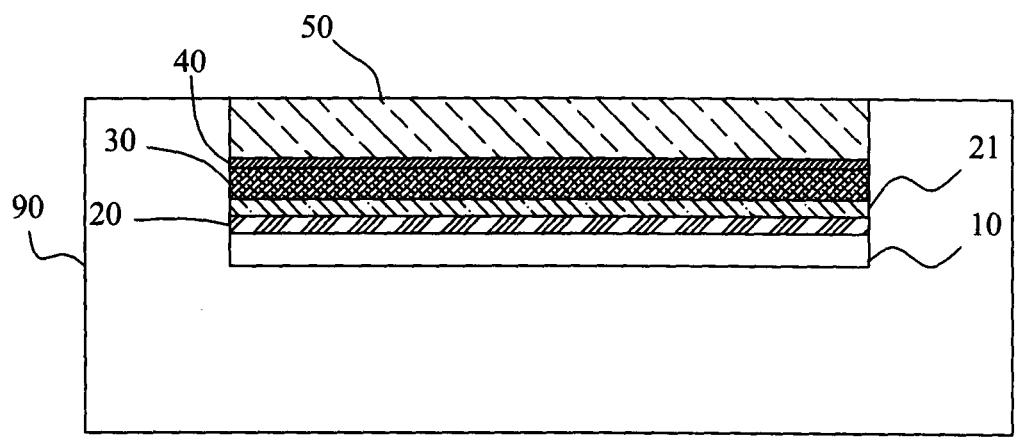
Figure 2C:
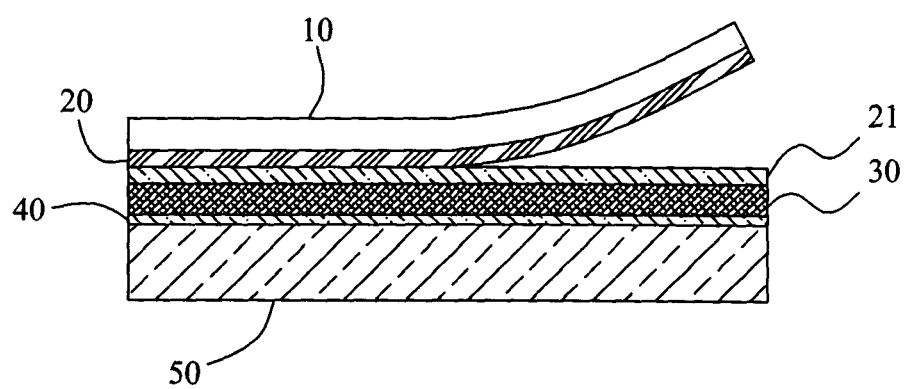

As shown in FIG. 2A, the finished film 10 which is the film 10 orderly combined with the stripping layer 20, the solar-powered paint layer 30, and the adhesive layer 40 is put in a mold 90. As shown in FIG. 2B, the injection molding technology is utilized to form the housing 50 in the mold 90 and combine the housing 50 with the film 10. The housing 50 and the film 10 are combined using the adhesive layer 40. The film 10 and the solar-powered paint layer 30 are easily to be combined and fixed with the housing 50 via the adhesive layer 40. Then, the film 10 is removed to form the housing (as shown in FIG. 2C). Since the stripping layer 20 is formed between the film 10 and the solar-powered paint layer 30, the film 10 together with the stripping layer 20 may be easily removed without affecting the solar-powered paint layer 30. Besides the IMD, the solar paint 30 may be combined with the housing 50 in a transfer mode such as heat transfer and water transfer.

At the time, the hardened layer 21 may be used as a protection layer for the solar-powered paint layer 30 to prevent the solar-powered paint layer 30 from being detached and abraded after a long term use. On the other hand, since the solar-powered paint layer 30 needs to absorb sunshine to be acted, the hardened layer 21 needs to be a transparent layer or a translucent layer allowing the light to penetrate to provide enough light to pass through.

As a result, the solar-powered paint layer 30 may be easily attached to the housing 50. When the housing 50 is used at the electronic device, the solar power is absorbed via the solar-powered paint layer 30, and it is converted into electric energy needed in the operation of the electronic device. Since the conversion procedure and structures are conventional technology which may be easily achieved by persons having ordinary skill in the art, they are not described herein for a concise purpose.

Figure 3:
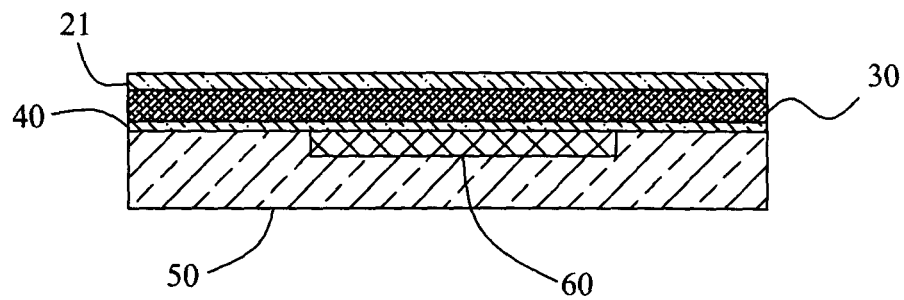
FIG. 3 is a schematic diagram showing an electronic device housing with solar paint formed a pattern layer and a manufacturing method thereof according to an embodiment of the invention.

The solar-powered paint layer 30 may be a blending color with a special pattern, and it may replace a conventional pattern layer. It also may be colorless and transparent without affecting the existing pattern layer 60 (as shown in FIG. 3). As a result, the solar paint may be smoothly commercialized to be effectively applied in products and mass-produced via the IMD technology.

Figure 4:
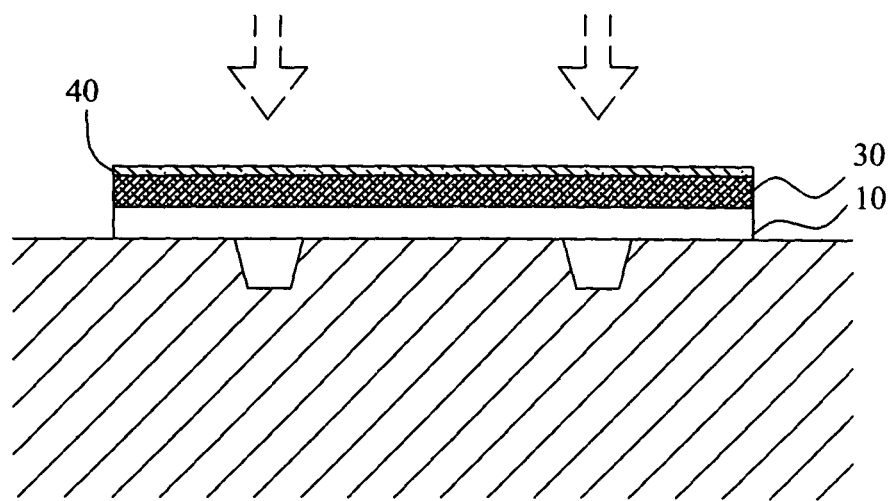
FIG. 4 is a schematic diagram showing an electronic device housing with solar paint and a manufacturing method thereof according to another embodiment of the invention.

Beside the IMR shown in FIG. 2A to FIG. 2C, the IML and the IMF also may be used. As shown in FIG. 4, since the film 10 does not need to be removed in the IML and the IMF, the stripping layer 20 and the hardened layer 21 are not disposed. Additionally, the film 10 is molded under high pressure before it is disposed in the mold 90 to form the pattern with two-dimensional (2D) curves (IML) or the pattern with three-dimensional (3D) curves (IMF).

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A method for manufacturing an electronic device housing with solar paint, comprising the steps of:
   providing a film;
   forming a solar-powered paint layer on the film, wherein the material of the solar-powered paint layer includes carbon nano tubes and carbon fullerene;
   placing the film with the solar-powered paint layer in a mold; and
   forming a housing in the mold to combine the housing and the solar-powered paint layer.

2. The method for manufacturing the electronic device housing with the solar paint according to claim 1, wherein the solar-powered paint layer is colorless and transparent.

3. The method for manufacturing the electronic device housing with the solar paint according to claim 1, wherein the solar-powered paint layer is colorful and forms a pattern.

4. The method for manufacturing the electronic device housing with the solar paint according to claim 1, wherein the solar-powered paint layer is formed on the film by coating.

5. The method for manufacturing the electronic device housing with the solar paint according to claim 1, further comprising:
   removing the film and making the solar-powered paint layer disposed on an outer surface of the housing.

6. The method for manufacturing the electronic device housing with the solar paint according to claim 1, further comprising:
   forming the film under high pressure before placing the film in the mold.

7. The method for manufacturing the electronic device housing with the solar paint according to claim 1, wherein the solar-powered paint layer further comprises an adhesive layer.

* * * * *